United States Patent
Liao et al.

(10) Patent No.: US 6,867,091 B1
(45) Date of Patent: Mar. 15, 2005

(54) METHOD FOR FORMING DEEP TRENCH CAPACITOR WITH LIQUID PHASE DEPOSITION OXIDE AS COLLAR OXIDE

(75) Inventors: Sam Liao, Taichung (TW); Shian-Jyh Lin, Yonghe (TW); Chia-Sheng Yu, Banciao (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/833,066

(22) Filed: Apr. 28, 2004

(51) Int. Cl.$^7$ .......................................... H01L 21/8242
(52) U.S. Cl. ..................................... 438/243; 438/386
(58) Field of Search ................................ 438/243–249, 438/386–392

(56) References Cited

U.S. PATENT DOCUMENTS 6,245,612 B1 * 6/2001 Chang et al. ............... 438/249
6,767,786 B1 * 7/2004 Lin et al. .................... 438/243

\* cited by examiner

*Primary Examiner*—Jack Chen
(74) *Attorney, Agent, or Firm*—Bacon & Thomas, PLLC

(57) ABSTRACT

A method for forming a deep trench capacitor mainly utilizes a liquid phase deposition (LPD) oxide to form a collar oxide layer in the trench, followed by forming a conductive layer serving as an upper electrode of the deep trench capacitor, thereby avoiding collar oxide residue in the conductive layer and thus forming good electrical connection. And, the method of the present invention does not need a dry etch to remove the unnecessary collar oxide layer such that the process can be simplified.

7 Claims, 4 Drawing Sheets

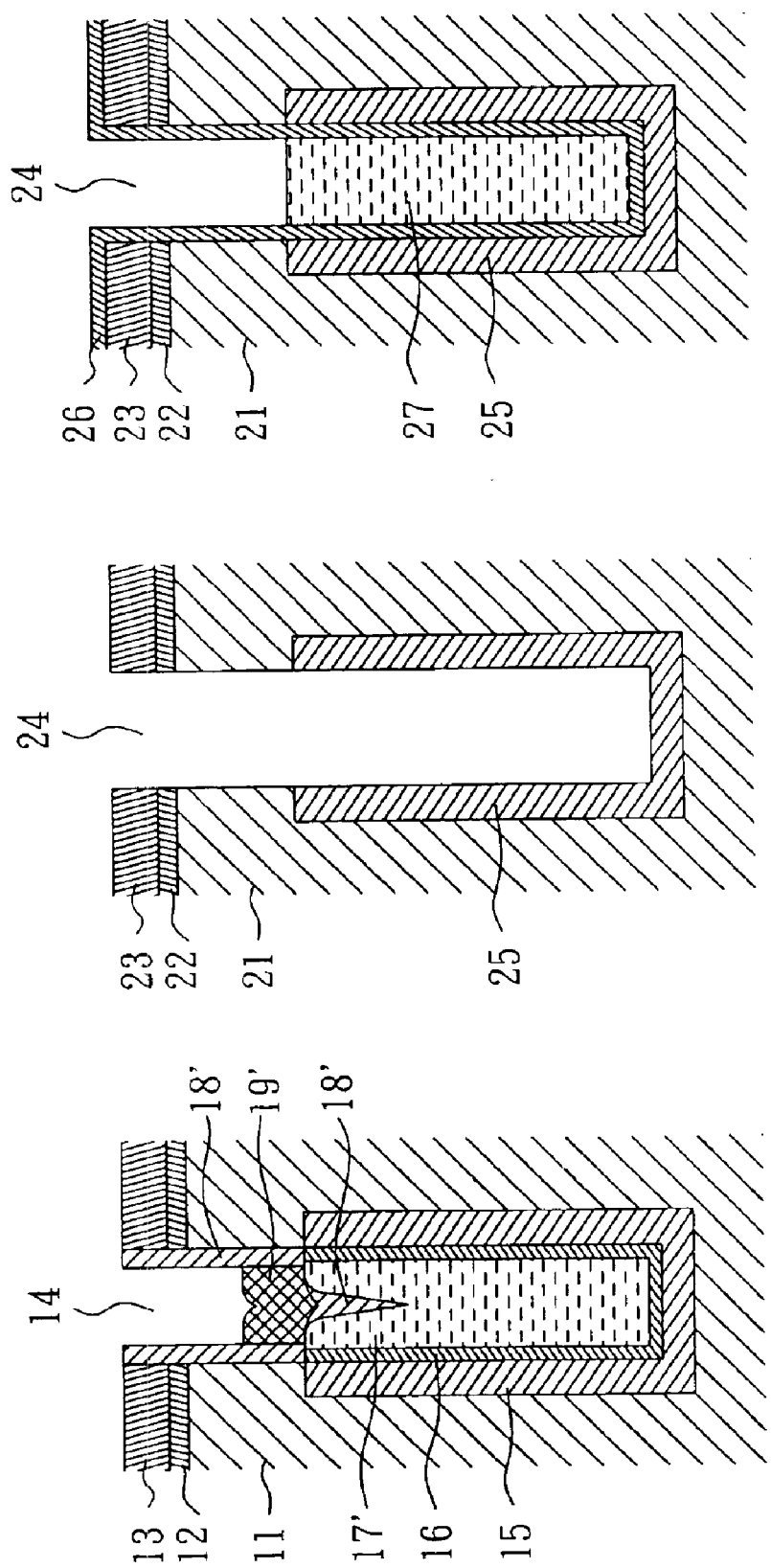

METHOD FOR FORMING DEEP TRENCH CAPACITOR WITH LIQUID PHASE DEPOSITION OXIDE AS COLLAR OXIDE

BACKGROUND OF THE INVENTION

1. Field of the Invention

The present invention relates to a semiconductor process, more specifically, to a method for forming a deep trench capacitor of a semiconductor memory.

2. Description of the Prior Art

Deep trench capacitors have been widely employed in the conventional semiconductor memory (such as DRAM) process, in order to reduce the occupied areas and to increase capacitances. FIGS. 1a and 1b present parts of a conventional deep trench capacitor process. The deep trench structure in FIG. 1a comprises a substrate 11 usually being a silicon substrate, a pad oxide layer 12, a pad nitride layer 13 usually being SiN, a trench 14, a buried plate (BP) 15 (i.e., the bottom electrode), a dielectric layer 16 usually containing nitride and oxide, a conductive layer 17 used as an upper electrode and usually being polysilicon, and an insulation layer 18, which is oxide usually and is used to form a collar oxide layer in the trench 14 in the subsequent process. Later, in FIG. 1b, the insulation layer 18 on the pad nitride layer 13 and the conductive layer 17 is removed by dry etching, for example, and the trench 14 is filled with the conductive layer 19, which is used as a connection electrode, by deposition and etching, for example, to engage the conductive layer 17. Then, a buried strap (BS) (not shown) is formed on the conductive layer 19 to engage an adjacent transistor (not shown), which is subsequently formed.

However, as shown in FIG. 1c, the aforementioned process would generates a conductive layer 17' with a recess and thereby generate an insulation layer 18' with a recess. Later in FIG. 1d, part of the insulation layer 18' remains in the recess of the conductive layer 17' after the removing of the insulation layer 18' on the pad nitride layer 13 and the conductive layer 17', and creates poor electrical connection between the conductive layer 19', which is subsequently formed, and the conductive layer 17', while the conductive layer 19' comprises a recess as well. In an extreme situation, the residual insulation layer 18' left in the recess still connects with the insulation layer 18' on the sides of the trench, so that the electrical connection cannot be formed by the conductive layer 19' and the conductive layer 17' and the deep trench capacitor is ineffective.

Therefore, a need for overcoming the above problem is required. The present invention fulfils this need.

SUMMARY OF THE INVENTION

A purpose of the present invention is to provide a method for forming a trench capacitor, which can prevent the insulation layer acting as the collar oxide layer from remaining in the conductive layer acting as the upper electrode, so that a good electrical connection between the conductive layer used as the upper electrode and the conductive layer used as the connection electrode can be formed.

Another purpose of the present invention is to provide a method for forming a trench capacitor, which does not require the dry etch to remove the unnecessary collar oxide layer/insulation layer on the upper electrode conductive layer, so that the process is simplified.

In accordance with an aspect of the present invention, a method for forming a trench capacitor comprises steps of providing a substrate; forming a mask layer of a predetermined pattern on the substrate to expose a portion of the substrate; forming a trench in the exposed portion of the substrate; forming a conductive diffusion region in the substrate at the periphery of the lower portion of the trench; forming a dielectric layer on the surface of the trench; filling the trench with a photoresist layer, and making the top of the photoresist layer at least not lower than the top of the conductive diffusion region; removing the dielectric layer on the surface of the trench not covered by the photoresist layer; forming a low temperature oxide layer on the surface of the trench not coverd by the photoresist layer; removing the photoresist layer in the trench; and filling the trench with a conductive layer and making the top of the conductive layer lower than the bottom of the low temperature oxide layer.

In accordance with another aspect of the present invention, a method for forming a trench capacitor comprises steps of providing a substrate; forming a mask layer of a predetermined pattern on the substrate to expose a portion of the substrate; forming a trench in the exposed portion of the substrate; filling the lower portion of the trench with a photoresist layer; forming a low temperature oxide layer on the surface of the trench not covered by the photoresist layer; removing the photoresist layer in the trench; forming a conductive diffusion region in the substrate at the periphery of the portion of the trench not covered by the low temperature oxide layer; forming a dielectric layer on the surfaces of the trench and the low temperature oxide layer; and filling the trench with a conductive layer, and making the top of the conductive layer lower than the bottom of the low temperature oxide layer.

In accordance with another aspect of the present invention, in the aforementioned methods, the top of the conductive diffusion region or the photoresist is lower than the bottom of a transistor adjacent to the trench and subsequently formed.

In accordance with another aspect of the present invention, in the aforementioned methods, the low temperature oxide layer is a liquid phase deposition layer

BRIEF DESCRIPTION OF THE DRAWINGS

The following drawings are not drawn according to practical dimensions and ratios and are only for illustrating the mutual relationships between the respective portions. In addition, the like reference numbers indicate the similar elements.

FIGS. 1a to 1d are the schematical sectional drawings illustrating the respective steps of part of the conventional process for forming a deep trench capacitor.

FIGS. 2a to 2d are the schematical sectional drawings illustrating the respective steps of the process for forming a deep trench capacitor in accordance with the first embodiment of the present invention.

DETAILED DESCRIPTION OF THE PREFERRED EMBODIMENT

Figure 1A:
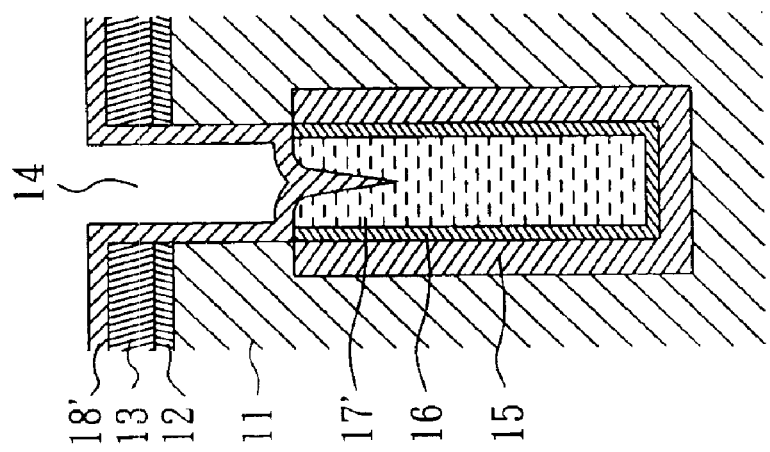

The embodiments of the present invention will be described in detail with reference to the accompanying drawings FIGS. 2a to 2d and 3a to 3d, the schematical sectional drawings illustrating the respective steps of the process for forming a deep trench capacitor in accordance with the present invention.

Please refer to FIG. 2a. On the substrate 21, which is usually a silicon substrate, a pad oxide layer 22 is formed by thermal process, for example, and a pad nitride layer 23 usually being SiN is formed by deposition process, for example. These layers as a whole are used as a mask layer in the subsequent process, and a predetermined pattern is formed by etching, for example, in these layers to expose a portion of the substrate. Then, a trench 24 is formed by etching, for example, in the exposed portion of the substrate, and then a conductive diffusion region 25 is formed in the substrate at the periphery of the lower portion of the trench 24 by Gas Phase Diffusion (GDP) or by the following steps: forming an arsenic silicon glass (ASG) layer (not shown) on the surface of the lower portion of the trench 24 by deposition and photoresist etching, for example; applying a TEOS oxide layer (not shown) to protect the portion not covered by the ASG layer; and implementing drive-in to the ASG layer by heat treatment, for example, to form the conductive diffusion region 25 which is used as the lower electrode of the capacitor, also referred to as buried plate (BP). The top of the conductive diffusion region 25 is lower than the bottom of a transistor adjacent to the trench 24 and subsequently formed, to prevent the conductive diffusion 25 improperly contacting the adjacent transistor. The TEOS and ASG layers are then removed.

In FIG. 2b, a dielectric layer 26 usually being nitride is formed on the surfaces of the whole structure by deposition, for example, and a photoresist layer 27 is formed in the trench 24 by coating and etching, for example. The top of the photoresist layer 27 is at least not lower than the top of the conductive diffusion region 25 so that the top of the dielectric layer 26 finally formed is not lower than the top of the conductive diffusion region 25, and the improper contact between the conductive diffusion region 25 of the lower electrode of the capacitor and the upper electrode subsequently formed in the trench 24 can be prevented.

Figure 2D:
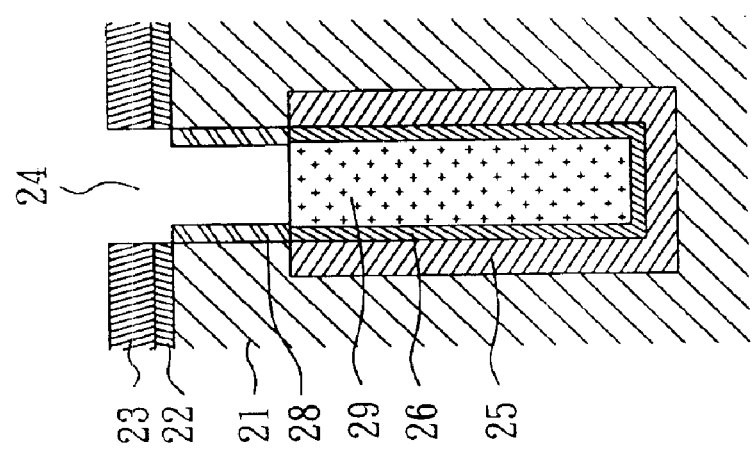
Figure 2C:
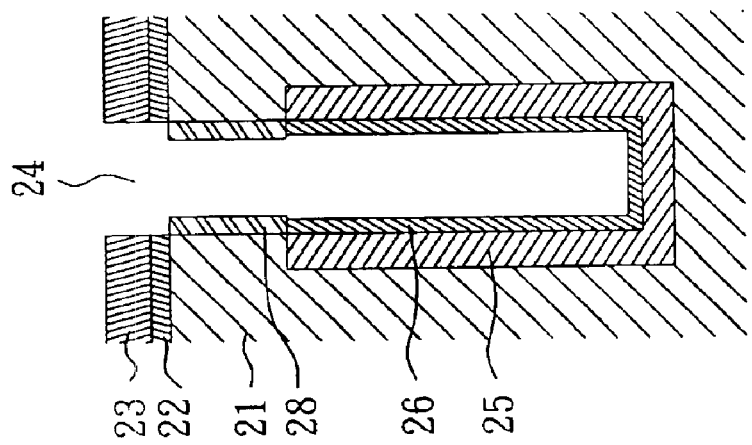

As shown in FIG. 2c, the dielectric layer 26 on the surface of the trench 24 not covered by the photoresist layer 27 is removed by etching, for example, and a liquid phase deposition (LPD) oxide layer 28 used as a collar oxide layer is formed on the surface of the trench 24 not covered by the dielectric layer 26. LPD characterizes in that it will not be formed on the photresist and can be implemented in a low temperature like the room temperature. Then the photoresist layer 27 is removed and an oxide layer (not shown) can be formed on the surface of the dielectric layer 26 by implementing heat treatment.

Please refer to FIG. 2d. The trench 24 is filled with a conductive layer 29, which usually is polysilicon, by deposition and etching, for example. The conductive layer 29 has its top lower than the bottom of the LPD oxide layer 28, and is used as the upper electrode of the deep trench capacitor. The main structure of the deep trench capacitor has been formed now.

Figure 3A:
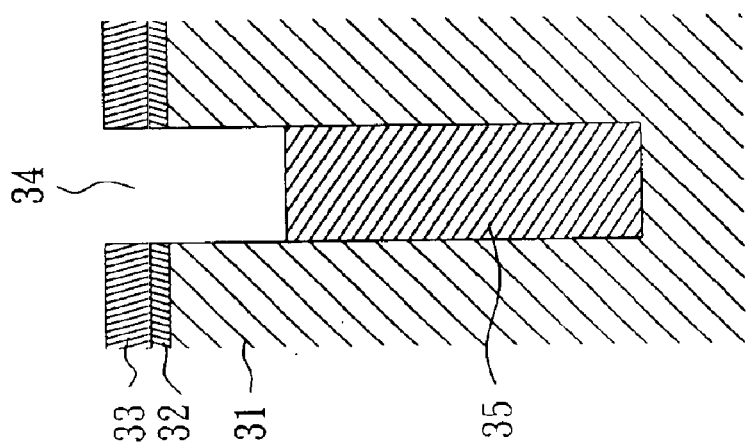
FIGS. 3a to 3d are the schematical sectional drawings illustrating the respective steps of the process for forming a deep trench capacitor in accordance with the second embodiment of the present invention.

In another embodiment shown in FIG. 3a, a substrate 31, a pad oxide layer 32, a pad nitride layer 33, and a trench 34 are formed in the same method of forming the substrate 21, the pad oxide layer 22, the pad nitride layer 23, and the trench 24 shown in FIG. 2a, respectively. A photoresist layer 35 is then formed in the lower portion of the trench 34 by coating and etching, for example. The top of the photoresist layer 35 is lower than the bottom of a transistor adjacent to the trench 34 and subsequently formed, so as to prevent the lower electrode of the capacitor subsequently formed from improperly contacting the adjacent transistor.

Figure 3D:
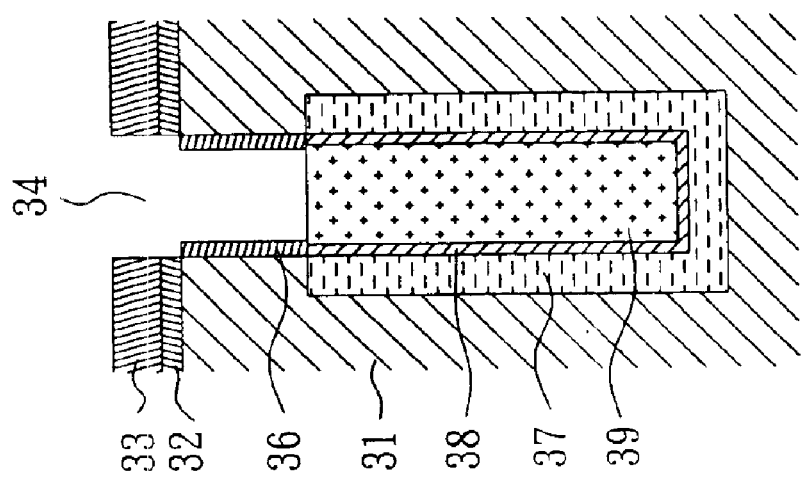
Figure 3C:
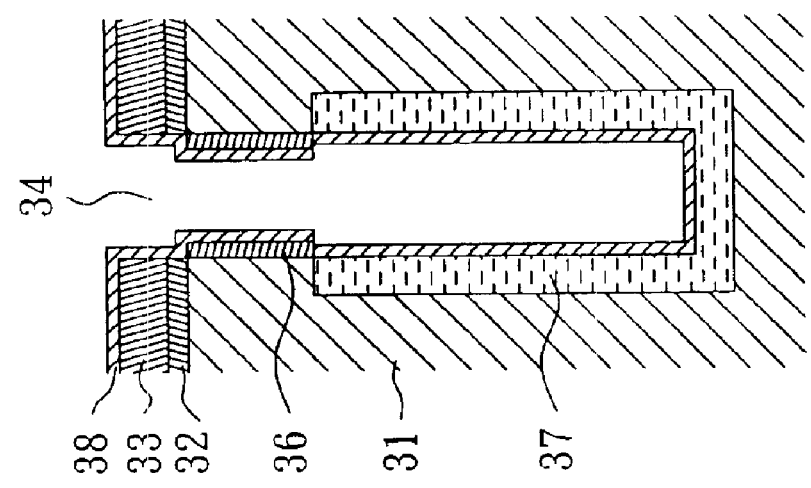
Figure 3B:
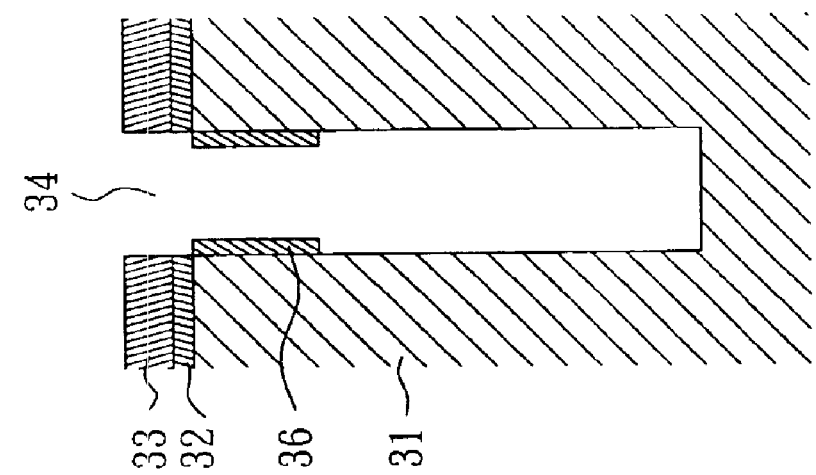

As shown in FIG. 3b, a liquid phase deposition (LPD) oxide layer 36, used as the collar oxide layer, is formed on the surface not covered by the photoresist layer 35 in the trench 34. The photoresist layer 35 is then removed.

In FIG. 3c, a conductive diffusion region 37 is formed in the substrate at the periphery of the portion of the trench 34 not covered by the LPD layer 36, in the same way of forming the conductive diffusion region 25. A dielectric layer 38 usually being nitride is formed on the surfaces of the whole structure by deposition, for example, and an oxide layer (not shown) can be formed on the surface of the dielectric layer 38 by implementing heat treatment.

Please refer to FIG. 3d. The trench 34 is filled with a conductive layer 39 usually being polysilicon by deposition and etching, for example. The conductive layer 39, has its top lower than the bottom of the LPD oxide layer 36, and is used as the upper electrode of the deep trench capacitor. The dielectric layer 38 not covered by the conductive layer 39 is then removed. The main structure of the deep trench capacitor has been formed now.

Then, as what has been well known, a connecting electrode (not shown) and a buried strap (BS) (not shown) are formed on the conductive layers 29 and 39, so as to engage the transistor formed in the adjacent active region.

Figure 1B:
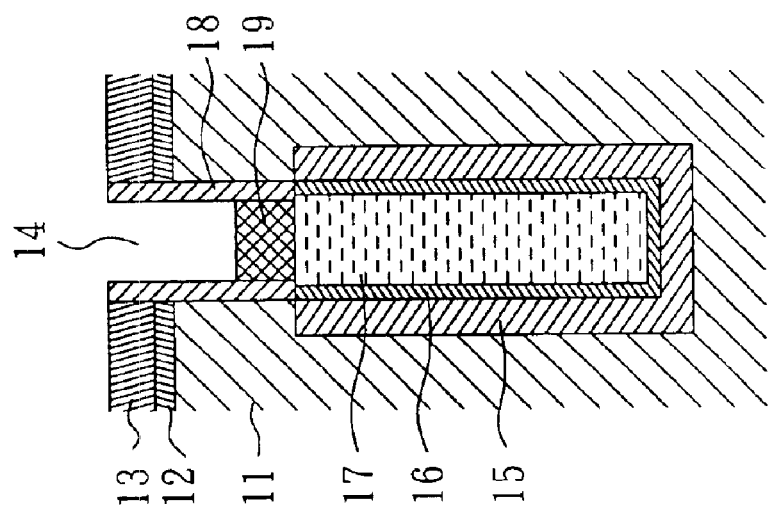
Figure 1C:
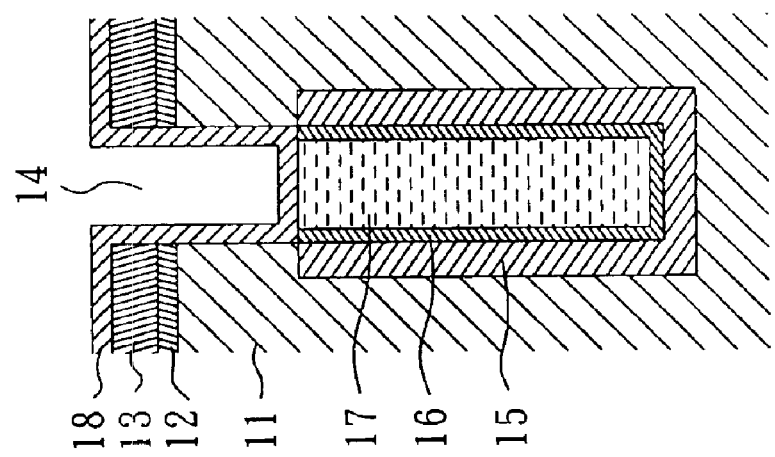

According to the method of the present invention for forming a deep trench capacitor, prior to forming the conductive layers 29 and 39, which are used as the upper electrodes of the deep trench capacitors, the liquid phase deposition (LPD) oxide layers 28 and 36 used as the collar oxide layers have been formed. By that there will be no poor electrical connection created due to the residual oxide layer in the recess, as the conventional techniques presented in FIG. 1d, even if the recess would be generated in the conductive layers 29 and 39. In addition, the method of the present invention does not require the use of dry etch to remove the unnecessary collar oxide layer insulation layer on the upper electrode conductive layer as the conventional techniques presented in FIG. 1b, so as to be capable of simplifying the process.

While the embodiments of the present invention are illustrated and described, various modifications and alterations can be made by persons skilled in this art. The embodiments of the present invention are therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A method for forming a trench capacitor comprising the steps of:

providing a substrate;

forming a mask layer of a predetermined pattern on the substrate to expose a portion of the substrate;

forming a trench in the exposed portion of the substrate;

forming a conductive diffusion region in the substrate at the periphery of the lower portion of the trench;

forming a dielectric layer on the surface of the trench;

filling the trench with a photoresist layer, and making the top of the photoresist layer at least not lower than the top of the conductive diffusion region;

removing the dielectric layer on the surface of the trench not covered by the photoresist layer;

forming a low temperature oxide layer on the surface of the trench not covered by the photoresist layer;

removing the photoresist layer in the trench; and filling the trench with a conductive layer and making the top of the conductive layer lower than the bottom of the low temple oxide layer.

2. The method as claimed in claim 1, wherein the conductive diffusion region is formed by use of Arsenic Silicon Glass (ASG) and heat treatment, or Gas Phase Diffusion (GDP).

3. The method as claimed in claim 1, wherein the top of the conductive diffusion region is lower than the bottom of a transistor adjacent to the trench and subsequently formed.

4. The method as claimed in claim 1, wherein the dielectric layer comprises a nitride layer.

5. The method as claimed in claim 4, wherein the dielectric layer also comprises an oxide layer.

6. The method as claimed in claim 1, wherein the low temperature oxide layer is a liquid phase deposition layer.

7. The method as claimed in claim 1, wherein the conductive layer comprises a polysilicon layer.

* * * * *